(12) United States Patent
Kim et al.

(10) Patent No.: US 11,105,709 B2
(45) Date of Patent: Aug. 31, 2021

(54) APPARATUS FOR TESTING DISPLAY MODULE AND METHOD FOR TESTING DISPLAY MODULE

(71) Applicant: Samsung Display Co., Ltd., Yongin-si (KR)

(72) Inventors: Jinhyeong Kim, Asan-si (KR); Sanghoon Lim, Cheonan-si (KR); Youngjin Oh, Bucheon-si (KR); KuHyun Kang, Suwon-si (KR); Sungjin Jang, Daejeon (KR)

(73) Assignee: Samsung Display Co., Ltd., Yongin-si (KR)

( * ) Notice: Subject to any disclaimer, the term of this patent is extended or adjusted under 35 U.S.C. 154(b) by 15 days.

(21) Appl. No.: 16/791,595

(22) Filed: Feb. 14, 2020

(65) Prior Publication Data
US 2020/0292413 A1    Sep. 17, 2020

(30) Foreign Application Priority Data

Mar. 13, 2019  (KR) .......................... 10-2019-0028572

(51) Int. Cl.
*G01M 11/02* (2006.01)
*H01L 51/56* (2006.01)
*G01B 11/02* (2006.01)
*G06T 7/60* (2017.01)

(52) U.S. Cl.
CPC ......... *G01M 11/0242* (2013.01); *G01B 11/02* (2013.01); *G01M 11/0207* (2013.01); *G06T 7/60* (2013.01); *H01L 51/56* (2013.01)

(58) Field of Classification Search
CPC .......... G01M 11/0242; G01M 11/0207; G01B 11/02; G06T 7/60; H01L 51/56

USPC .......................................... 356/626; 382/141
See application file for complete search history.

(56) References Cited

U.S. PATENT DOCUMENTS

| | | | | |
|---|---|---|---|---|
| 4,647,208 A | * | 3/1987 | Bieman | G01B 11/00 348/94 |
| 5,264,918 A | * | 11/1993 | Kagami | H01L 21/681 356/150 |
| 5,655,030 A | * | 8/1997 | Suzuki | G06T 7/62 348/95 |
| 5,771,309 A | * | 6/1998 | Yamaoka | G01B 11/002 348/94 |

(Continued)

FOREIGN PATENT DOCUMENTS

| | | |
|---|---|---|
| KR | 10-0575307 B1 | 5/2006 |
| KR | 10-1474259 B1 | 12/2014 |
| KR | 10-2015-0045076 A | 4/2015 |

(Continued)

*Primary Examiner* — Roy M Punnoose
(74) *Attorney, Agent, or Firm* — Lewis Roca Rothgerber Christie LLP

(57) ABSTRACT

A method for testing a display module may include providing light to the display module, obtaining an image of the display module, measuring a first center of a hole in the display module, measuring a first distance from the first center to an edge of the hole, measuring a second center of a closed line formed by a signal line of the display module, measuring a second distance from the second center to the signal line, calculating a third distance between the first center and the second center, and comparing the second distance with a sum of the first distance and the third distance.

20 Claims, 15 Drawing Sheets

(56) References Cited

U.S. PATENT DOCUMENTS

2017/0075174 A1 3/2017 Lee et al.
2018/0356661 A1 12/2018 Lee

FOREIGN PATENT DOCUMENTS

| KR | 10-2017-0031837 A | 3/2017 |
| KR | 10-2017-0090774 A | 8/2017 |
| KR | 10-1863950 B1 | 7/2018 |
| KR | 10-2018-0134678 A | 12/2018 |

* cited by examiner

APPARATUS FOR TESTING DISPLAY MODULE AND METHOD FOR TESTING DISPLAY MODULE

CROSS-REFERENCE TO RELATED APPLICATION

This application claims priority to, and the benefit of, Korean Patent Application No. 10-2019-0028572, filed on Mar. 13, 2019, the entire contents of which are hereby incorporated by reference.

BACKGROUND

The present disclosure relates to an apparatus for testing a display module, and a method for testing a display module, which are capable of measuring a cutting accuracy of a hole in the display module.

A display device may include various electronic components, such as a display module for displaying an image and sensing an external input, and an electronic module. The electronic module may include a camera, an infrared sensor, and/or a proximity sensor. The electronic module may be located under or beneath the display module. In this case, a hole may be defined in the display module.

A cutting accuracy of the hole formed in the display module may be tested using a marker located adjacent to the hole. However, because the marker is located in the display module, a non-display area around the hole may be increased due to the presence of the marker.

SUMMARY

The present disclosure may provide an apparatus for testing a display module, and a method for testing a display module, the apparatus and method being capable of measuring cutting accuracies by taking or obtaining images of holes having various shapes and of signal lines having various shapes.

In an embodiment, a method for testing a display module may include providing light to the display module, obtaining an image of the display module, measuring a first center of a hole in the display module, measuring a first distance from the first center to an edge of the hole, measuring a second center of a closed line formed by a signal line of the display module, measuring a second distance from the second center to the signal line, calculating a third distance between the first center and the second center, and comparing the second distance with a sum of the first distance and the third distance.

The first center and the first distance may be measured from a bright portion of the obtained image.

The second center and the second distance may be measured from a dark portion of the obtained image of the display module.

The first center and the first distance may be measured from a dark portion of the obtained image.

The second center and the second distance may be measured from a bright portion of the obtained image.

The first distance may be a shortest distance from the first center to the edge of the hole.

The second distance may be a shortest distance from the second center to the signal line.

At least a portion of the hole may include a portion of a circle having a curvature.

The closed line formed by the signal line may have a circular shape or a polygonal shape.

The method may further include determining that the display module is a good product when the sum of the first distance and the third distance is less than the second distance.

The comparing of the second distance with the sum of the first distance and the third distance may include calculating a difference between the second distance and the sum of the first distance and the third distance.

The comparing of the second distance with the sum of the first distance and the third distance may further include comparing the difference with a reference value.

In an embodiment, an apparatus for testing a display module may include a light source configured to provide light to the display module, a camera configured to obtain an image of the display module using the provided light, and an analyzer configured to analyze the obtained image, wherein the display module includes a base layer including an active area with a hole defined therein, and a peripheral area adjacent to the active area, signal lines at the active area, and surrounding the hole in a plan view, and pixels at the active area, and electrically connected to the signal lines, wherein the analyzer is configured to compare a sum of a third distance, which is from a first center of the hole to a second center of a closed line formed by a signal line that is closest to the hole in the plan view among the signal lines, and a first distance, which is from the first center to an edge of the hole, with a second distance, which is from the second center to the signal line closest to the hole among the signal lines.

The light source may face the camera with the display module therebetween.

The light source and the camera may be located over the display module.

Each of the signal lines may form a closed line surrounding the hole when viewed in the plan view.

The closed line formed by each of the signal lines in the plan view may have a circular shape or a polygonal shape.

The hole may have a polygonal shape of which at least one vertex has a curvature in the plan view.

The light source may be configured to provide the light to the display module in a state where the light source, the camera, and the hole overlap each other in the plan view.

The light source may be configured to provide the light to the display module in a state where the light source, the camera, and the signal lines overlap each other in the plan view.

BRIEF DESCRIPTION OF THE DRAWINGS

The accompanying drawings are included to provide a further understanding, and are incorporated in and constitute a part of this specification. The drawings illustrate embodiments and, together with the description, serve to explain various aspects. In the drawings.

DETAILED DESCRIPTION

Figure 1:
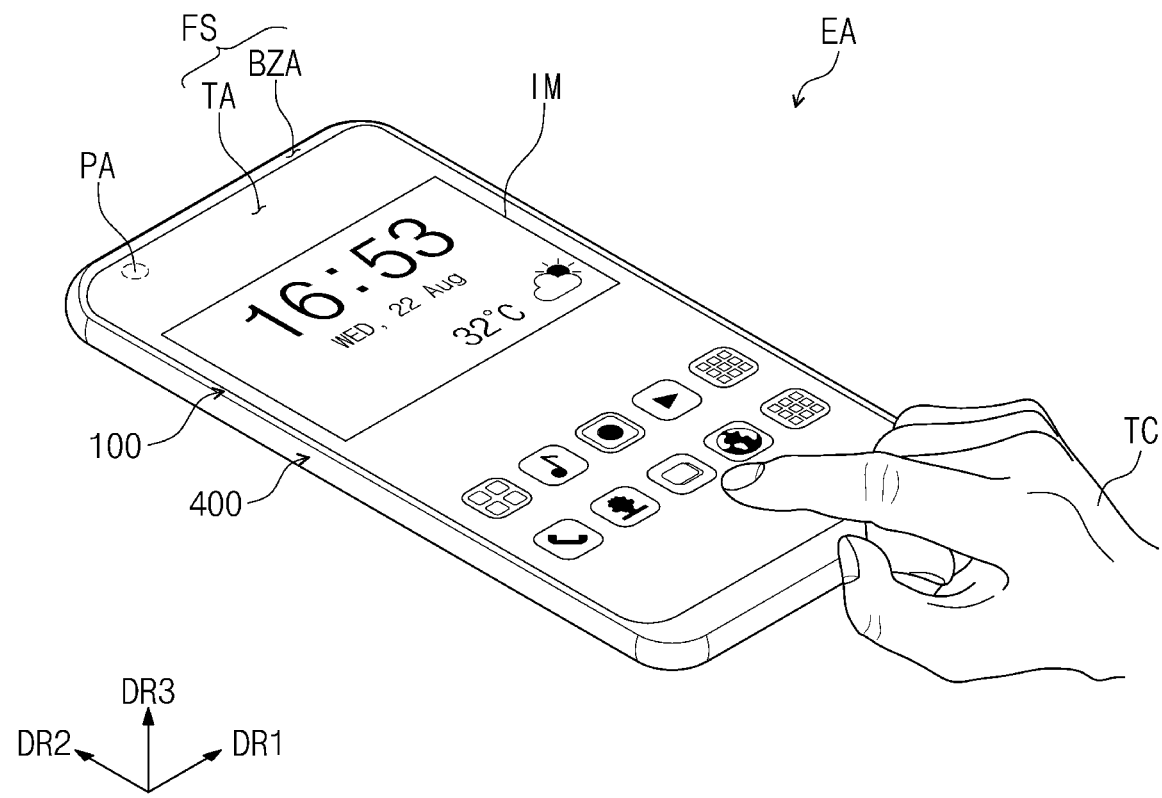
FIG. 1 is a perspective view illustrating a display device according to an embodiment.

Embodiments now will be described more fully hereinafter with reference to the accompanying drawings, in which various embodiments are shown. The disclosed embodiment may, however, be embodied in many different forms, and should not be construed as limited to the embodiments set forth herein. Rather, these embodiments are provided so that this disclosure will be thorough and complete, and will fully convey the scopes to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of embodiments.

Hereinafter, embodiments will be described in detail with reference to the accompanying drawings.

Figure 2:
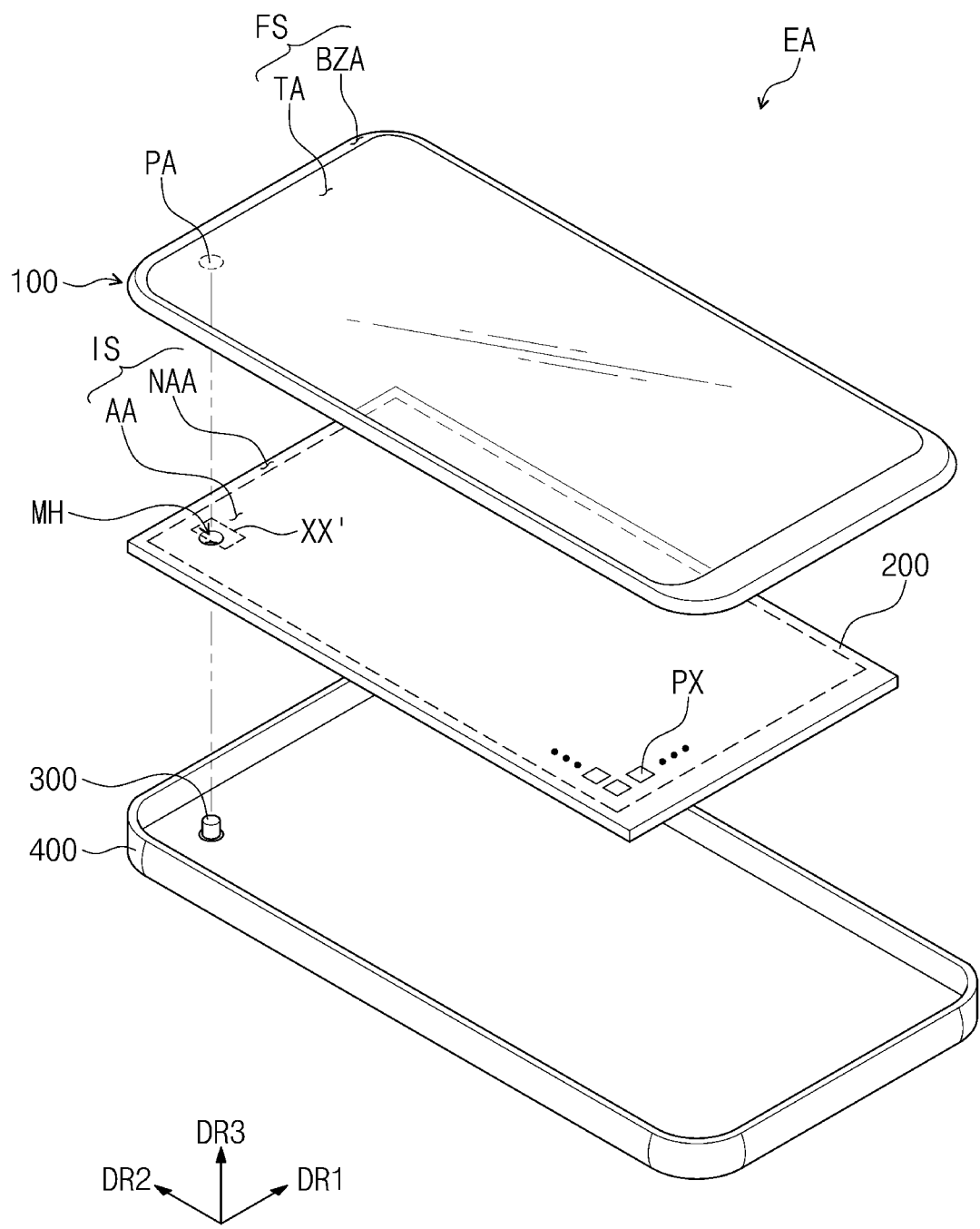
FIG. 2 is an exploded perspective view illustrating a display device according to an embodiment.

FIG. 1 is a perspective view illustrating a display device according to an embodiment, and FIG. 2 is an exploded perspective view illustrating a display device according to an embodiment.

Referring to FIGS. 1 and 2, a display device EA may be activated by an electrical signal. The display device EA may be realized as various embodiments. For example, the display device EA may be realized as a tablet, a notebook computer, a personal computer, a television, or a smart phone. In the present embodiment, a smart phone is illustrated as an example of the display device EA.

The display device EA may display an image IM on a display surface FS that is parallel to first and second directions DR1 and DR2, the image IM being generally displayed in a third direction DR3. The display surface FS on which the image IM is displayed may correspond to a front surface of the display device EA, and may correspond to a front surface of a window 100. Hereinafter, the display surface, the front surface of the display device EA, and the front surface of the window 100 may be indicated by the same reference designator. The image IM may include a dynamic image and a static image. In FIG. 1, a time display box and application icons are illustrated as an example of the image IM.

In the present embodiment, a front surface (or a top surface) and a rear surface (or a bottom surface) of each member may be defined based on a direction (e.g., the third direction DR3) in which the image IM is displayed. The front surface and the rear surface may be opposite to each other in the third direction DR3, and a normal direction of each of the front surface and the rear surface may be generally parallel to the third direction DR3. In the present specification, a thickness direction may mean the third direction DR3.

However, directions indicated by the first to third directions DR1, DR2, and DR3 may be relative concepts, and may be changed into other directions. Hereinafter, the first to third directions are respectively indicated by DR1, DR2, and DR3 illustrated in FIG. 1. In the present specification, a view (or plane) defined by the first and second directions DR1 and DR2 may correspond to a plan view, and it may be understood that when one or more components are viewed in a plan view, it/they may be viewed in a direction that is opposite to the third direction DR3 (e.g., may be viewed in a downward direction).

The third direction DR3 may intersect the first and second directions DR1 and DR2. For example, the first, second, and third directions DR1, DR2, and DR3 may be perpendicular to each other.

The display device EA may include the window 100, a display module 200, an electronic module 300, and a housing 400. In the present embodiment, the window 100 and the housing 400 may be coupled to each other to form the exterior of the display device EA.

The window 100 may include an optically transparent insulating material. For example, the window 100 may include glass or plastic. The window 100 may have a single-layered or multi-layered structure. For example, the window 100 may include a plurality of plastic films coupled to each other by an adhesive, or may include a glass substrate and a plastic film coupled to each other by an adhesive.

The window 100 may include a transmission area TA and a bezel area BZA when viewed in a plan view. The transmission area TA may be optically transparent. A light transmittance of the bezel area BZA may be less than a light transmittance of the transmission area TA. The bezel area BZA may define a shape of the transmission area TA. The bezel area BZA may be adjacent to the transmission area TA, and may surround the transmission area TA in a plan view.

The bezel area BZA may be colored (e.g., may have a predetermined color). The bezel area BZA may cover a peripheral area NAA of the display module 200 to prevent the peripheral area NAA from being visible to the outside. However, the disclosed embodiments are not limited thereto. In another embodiment, the bezel area BZA may be omitted from the window 100.

In an embodiment, a sensor area PA may be an area overlapping with the electronic module 300 to be described later in detail. The display device EA may receive an external signal required for the electronic module 300 through the sensor area PA, and/or may provide a signal outputted from the electronic module 300 to the outside through the sensor area PA. According to the present embodiment, the sensor area PA may overlap, or may be within, the transmission area TA. Thus, an additional area for the sensor area PA may be omitted from the transmission area TA. When the sensor area PA is located within the transmission area TA, an area (or size) of the bezel area BZA may be reduced.

In FIG. 2, one sensor area PA is illustrated as an example. However, embodiments are not limited thereto. In other embodiments, the sensor area PA may be provided in plurality. In addition, the sensor area PA is defined at the top left of the transmission area TA in FIG. 2. Alternatively, the sensor area PA may be defined at one of other various positions, such as the top right, the central portion, the bottom left, and/or the bottom right of the transmission area TA.

The display module 200 may be located under the window 100. The term 'under' used herein may mean a direction opposite to a direction in which the display module 200 provides an image. The display module 200 may display the image IM, and may sense an external input (e.g., a user's touch) TC. The display module 200 may include a front surface IS including an active area AA and the peripheral area NAA. The active area AA may be an area that is configured to be activated by an electrical signal.

The display module 200 according to an embodiment may be, but is not limited to, a light emitting type display module. For example, the display module 200 may be an organic light emitting display module, or may be a quantum-dot light emitting display module. An emission layer of the organic light emitting display module may include an organic light emitting material. An emission layer of the quantum-dot light emitting display module may include quantum dots and/or quantum rods. Hereinafter, the organic light emitting display module will be described as an example of the display module 200.

In the present embodiment, the active area AA may be an area in which an image is displayed, and may also be an area in which the external input TC is sensed. The transmission area TA may overlap with at least the active area AA. For example, the transmission area TA may overlap with the whole of, or with at least a portion of, the active area AA. Thus, a user may view the image IM through the transmission area TA and/or may provide the external input TC through the transmission area TA.

The display module 200 may include a pixel PX located in the active area AA. The pixel PX may be provided in plurality, and the plurality of pixels PX may be arranged in the active area AA. Lights generated from the pixels PX may form the image IM.

The peripheral area NAA may be covered by the bezel area BZA. The peripheral area NAA may be adjacent to the active area AA. The peripheral area NAA may surround the active area AA when viewed in a plan view. A driving circuit and/or driving lines for driving the active area AA may be located in the peripheral area NAA.

In the present embodiment, the display module 200 may be assembled in a flat state where the active area AA and the peripheral area NAA face the window 100. However, embodiments are not limited thereto. In another embodiment, a portion of the peripheral area NAA may be bent. In this case, a portion of the peripheral area NAA may face a rear surface of the display device EA, and thus an area (or size) of the bezel area BZA in the front surface of the display device EA may be reduced. In still another embodiment, the display module 200 may be assembled in a state where a portion of the active area AA is also bent. In yet another embodiment, the peripheral area NAA may be omitted from the display module 200.

The display module 200 may be configured to generate the image IM. The image IM generated from the display module 200 may be displayed on the front surface IS, and may be visible to a user through the transmission area TA.

A hole MH may be defined in an area of the display module 200 that corresponds to the sensor area PA. The hole MH may be defined in the active area AA, and may penetrate the display module 200. The hole MH may have a cylindrical shape having a height in the third direction DR3. The hole MH may be formed by removing components of the display module 200 that overlap with the sensor area PA. Because the hole MH is defined in the active area AA, the sensor area PA may be provided in the transmission area TA.

The electronic module 300 may be located under the display module 200. The electronic module 300 may overlap with the hole MH and the sensor area PA when viewed in a plan view. The hole MH may overlap with the electronic module 300 when viewed in a plan view. The electronic module 300 may be received in the hole MH or may have a similar size to that of the hole MH. The electronic module 300 may receive an external input through the hole MH, and/or a signal that is outputted from the electronic module 300 may be provided to the outside through the hole MH.

The housing 400 may be coupled to the window 100. The housing 400 and the window 100 may be coupled to each other to provide an inner space. The display module 200 and the electronic module 300 may be received in the inner space.

The housing 400 may be formed of a material having relatively high rigidity. For example, the housing 400 may include glass, plastic, or a metal, or may include a plurality of frames and/or plates formed of glass, plastic, metal, or a combination thereof. The housing 400 may stably protect the components of the display device EA received in the inner space from an external impact.

Figure 3:
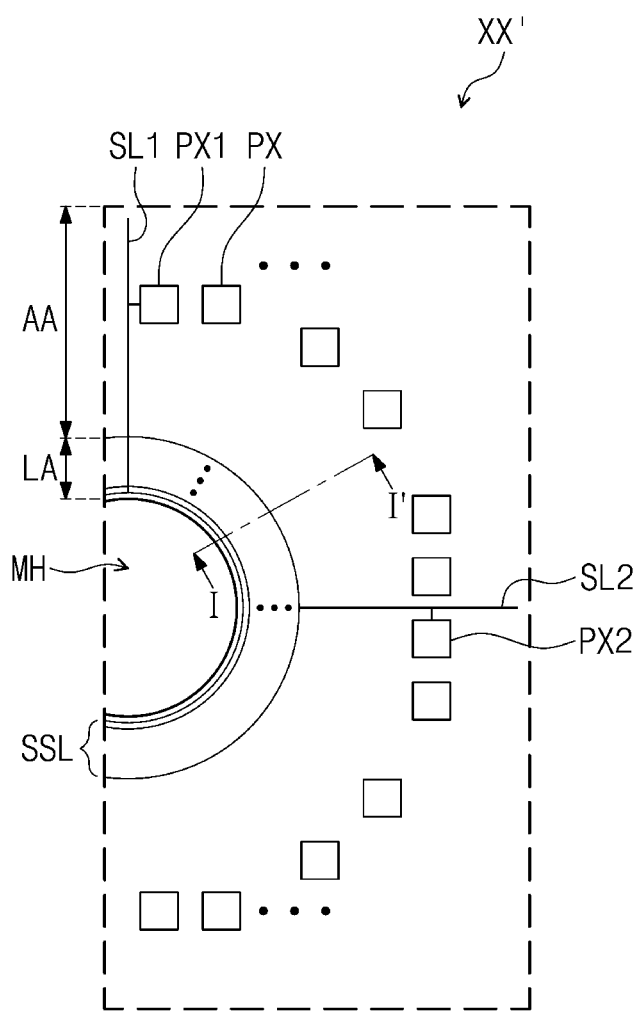
FIG. 3 is an enlarged plan view of an area XX' of FIG. 2.

FIG. 3 is an enlarged plan view of an area XX' of FIG. 2.

Referring to FIG. 3, a line area LA may surround the hole MH when viewed in a plan view. In the present embodiment, the line area LA may have a concentric circular shape with the hole MH. However, embodiments are not limited thereto. In other embodiments, the line area LA may have one of other various shapes surrounding the hole MH in a plan view.

Signal lines SSL may be located in the line area LA. The signal lines SSL may extend along an edge of the hole MH. Each of the signal lines SSL may have a closed line shape (e.g., a closed curve shape) surrounding the hole MH in a plan view. In the present embodiment, each of the signal lines SSL may have a circular shape.

The signal lines SSL may be arranged to be spaced apart from each other in the line area LA. The signal lines SSL may transmit signals that are independent of each other. For example, the signal lines SSL may include at least one of a line for transmitting a gate signal, a line for transmitting a data signal, a line for transmitting an initialization voltage, a line for transmitting an emission control signal, and/or a line for transmitting a power source voltage.

The signal lines SSL may include n lines, which are sequentially arranged from the hole MH and are spaced apart from each other. The n lines may be configured to transmit electrical signals provided to pixels located in rows and columns in which the hole MH is located.

The signal lines SSL may be electrically connected to main signal lines SL1 and SL2 respectively connected to pixels adjacent to the hole MH. In detail, the signal lines SSL may be connected to the main signal lines SL1 and SL2, which are in turn connected to the pixels, to transmit electrical signals to corresponding pixels.

The main signal lines SL1 and SL2 may include a first main signal line SL1 and a second main signal line SL2. In an embodiment, each of the first and second main signal lines SL1 and SL2 may be provided in plurality to correspond to some of the n signal lines SSL, respectively.

The first main signal line SL1 may extend in the second direction DR2. The first main signal line SL1 may be a data line for providing a data signal to a first pixel PX1. The second main signal line SL2 may extend in the first direction DR1. The second main signal line SL2 may be a gate line for providing a gate signal to a second pixel PX2. However, embodiments are not limited thereto. The main signal lines SL1 and SL2 may be realized as various line shapes that are connected to the pixels PX located in the active area AA, and that are configured to provide electrical signals for controlling the pixels PX.

Figure 4:
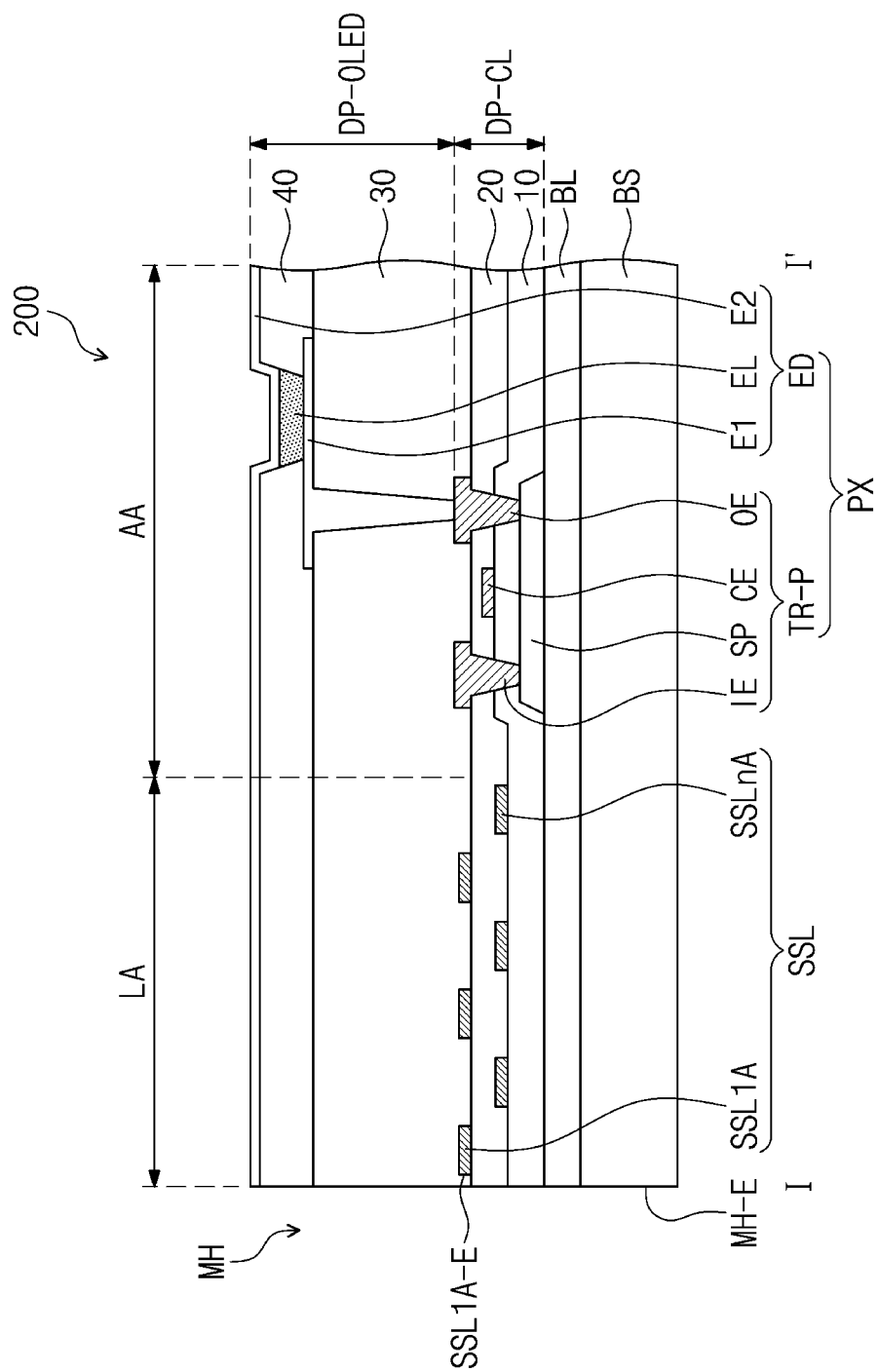
FIG. 4 is a cross-sectional view taken along the line I-I' of FIG. 3.

FIG. 4 is a cross-sectional view taken along the line I-I' of FIG. 3.

Referring to FIG. 4, the display module 200 may include the pixel PX and the signal line SSL.

The pixel PX may be located in the active area AA. The pixel PX may include a pixel transistor TR-P and a light emitting element ED. The pixel transistor TR-P may be located on an insulating substrate BS. The pixel transistor TR-P may be included in a circuit layer DP-CL. In the present embodiment, the display module 200 may include a base layer BL located between the circuit layer DP-CL and the insulating substrate BS.

The base layer BL may include a single insulating layer or a plurality of insulating layers. For example, the base layer BL may include at least one of a buffer layer or a barrier layer. Thus, the circuit layer DP-CL may be stably formed on the base layer BL, and the base layer BL may reduce or prevent oxygen or moisture from permeating into the circuit layer DP-CL through the insulating substrate BS.

The pixel transistor TR-P may include a semiconductor pattern SP, a control electrode CE, an input electrode IE, and an output electrode OE. The control electrode CE of the pixel transistor TR-P may be spaced apart from the semiconductor pattern SP with a first insulating layer 10 interposed therebetween.

The input electrode IE and the output electrode OE of the pixel transistor TR-P may be spaced apart from the control electrode CE of the pixel transistor TR-P with a second insulating layer 20 interposed therebetween. The input electrode IE and the output electrode OE of the pixel transistor TR-P may penetrate the first and second insulating layers 10 and 20 so as to be connected to one side portion of the semiconductor pattern SP and to another side portion of the semiconductor pattern SP, respectively.

In other embodiments, in the pixel transistor TR-P, the control electrode CE may be located under the semiconductor pattern SP, and/or the input electrode IE and the output electrode OE may be located under the semiconductor pattern SP or may be located on the same layer as the semiconductor pattern SP so as to be connected directly to the semiconductor pattern SP. The pixel transistor TR-P according to an embodiment may have any one of various structures, and is not limited to a specific embodiment.

The light emitting element ED may be located on a third insulating layer 30. The light emitting element ED and a fourth insulating layer 40 may be included in a display element layer DP-OLED. The light emitting element ED may include a first electrode E1, an emission layer EL, and a second electrode E2, which are sequentially stacked in the third direction DR3.

The first electrode E1 may penetrate the third insulating layer 30 so as to be connected to the pixel transistor TR-P. In another embodiment, a connection electrode may be additionally located between the first electrode E1 and the pixel transistor TR-P. In this case, the first electrode E1 may be electrically connected to the pixel transistor TR-P through the connection electrode.

The fourth insulating layer 40 may be located on the third insulating layer 30. An opening may be defined in the fourth insulating layer 40. The opening may expose at least a portion of the first electrode E1. The fourth insulating layer 40 may be a pixel defining layer.

The emission layer EL may be located on the first electrode E1. The emission layer EL may include a light emitting material. For example, the emission layer EL may include at least one of materials for emitting red light, green light, and/or blue light. The emission layer EL may include a fluorescent material or a phosphorescent material. The emission layer EL may include an organic material and/or an inorganic material. The emission layer EL may emit light in response to a potential difference between the first electrode E1 and the second electrode E2.

The second electrode E2 may be located on the emission layer EL. The second electrode E2 may be opposite to the first electrode E1. The second electrode E2 may include a transparent conductive material or a semi-transparent conductive material. Thus, light generated from the emission layer EL may easily exit in the third direction DR3 through the second electrode E2. However, the present disclosure is not limited thereto. In another embodiment, the first electrode E1 may include a transparent or semi-transparent conductive material, and the light emitting element ED may be driven in a rear surface light emitting type. In still another embodiment, the light emitting element ED may be driven in a both surface/two-way light emitting type in which light exits through a front surface and a rear surface.

In another embodiment, the light emitting element ED may further include at least one organic layer and/or at least one inorganic layer located between the emission layer EL and the first electrode E1 and/or between the emission layer EL and the second electrode E2. The organic layer and/or the inorganic layer may control movement of charges flowing from the first and second electrodes E1 and E2 into the emission layer EL to improve light efficiency and life span of the light emitting element ED.

The hole MH may be formed to penetrate the display module 200. Thus, the insulating substrate BS, the base layer BL, and the first to fourth insulating layers 10, 20, 30, and 40 may form a side surface MH-E of the hole MH, which defines an inner surface of the hole MH.

The signal lines SSL may be located in the line area LA. A first signal line SSL1A and an n-th signal line SSLnA among the signal lines SSL are illustrated as an example in FIG. 4 for the purpose of ease and convenience in description and illustration. The first signal line SSL1A may be connected to a data line, and the n-th signal line SSLnA may be connected to a gate line.

In the present embodiment, the first signal line SSL1A and the n-th signal line SSLnA may be located on different layers. For example, the first signal line SSL1A may be located between the second insulating layer 20 and the third insulating layer 30, and may be located on the same layer as the input and output electrodes IE and OE of the pixel transistor TR-P. The n-th signal line SSLnA may be located between the first insulating layer 10 and the second insulating layer 20, and may be located on the same layer as the control electrode CE of the pixel transistor TR-P.

However, embodiments are not limited thereto. In another embodiment, the first signal line SSL1A and the n-th signal line SSLnA may be located on the same layer. For example, the first signal line SSL1A and the n-th signal line SSLnA may be located between the second insulating layer 20 and the third insulating layer 30, and/or may be located on the same layer as the input and output electrodes IE and OE of the pixel transistor TR-P.

Figure 5:
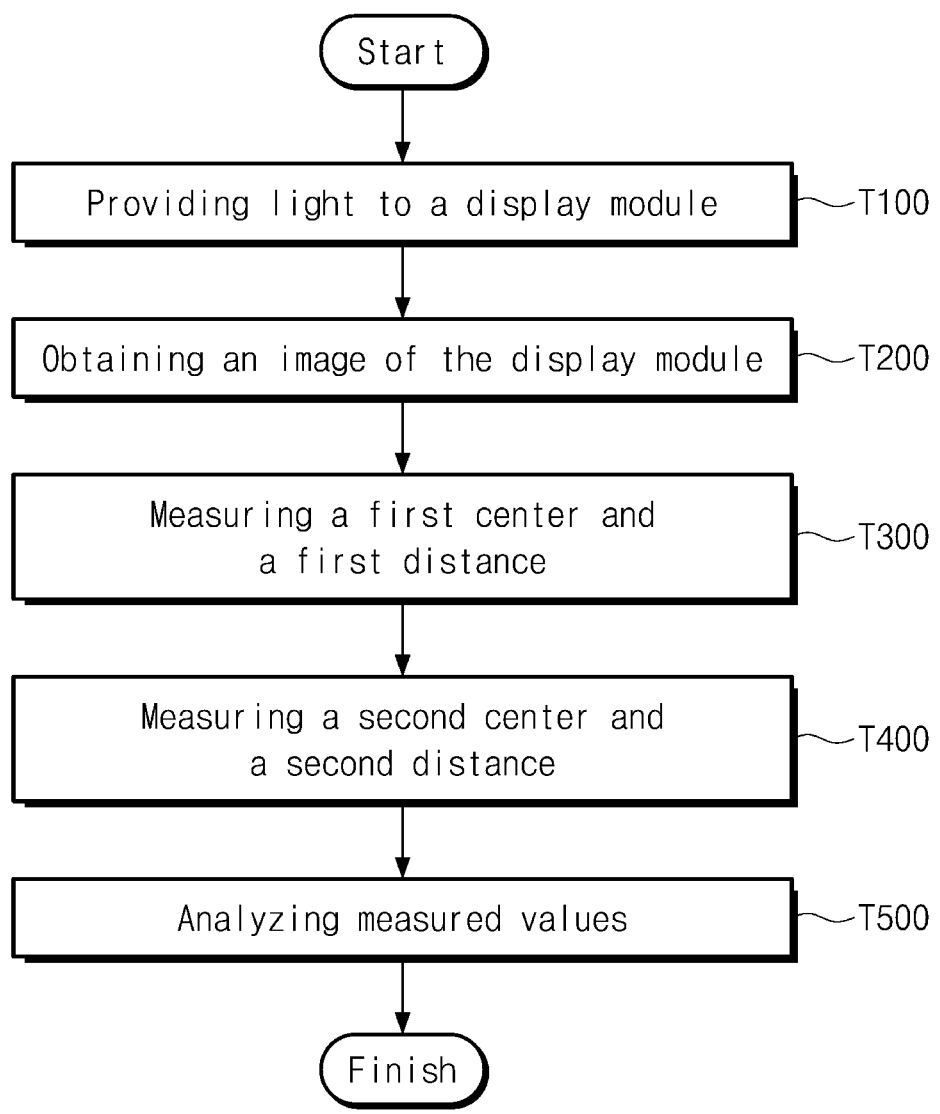
FIG. 5 is a flowchart illustrating a method for testing a display module by using an apparatus for testing a display module, according to an embodiment.
Figure 6:
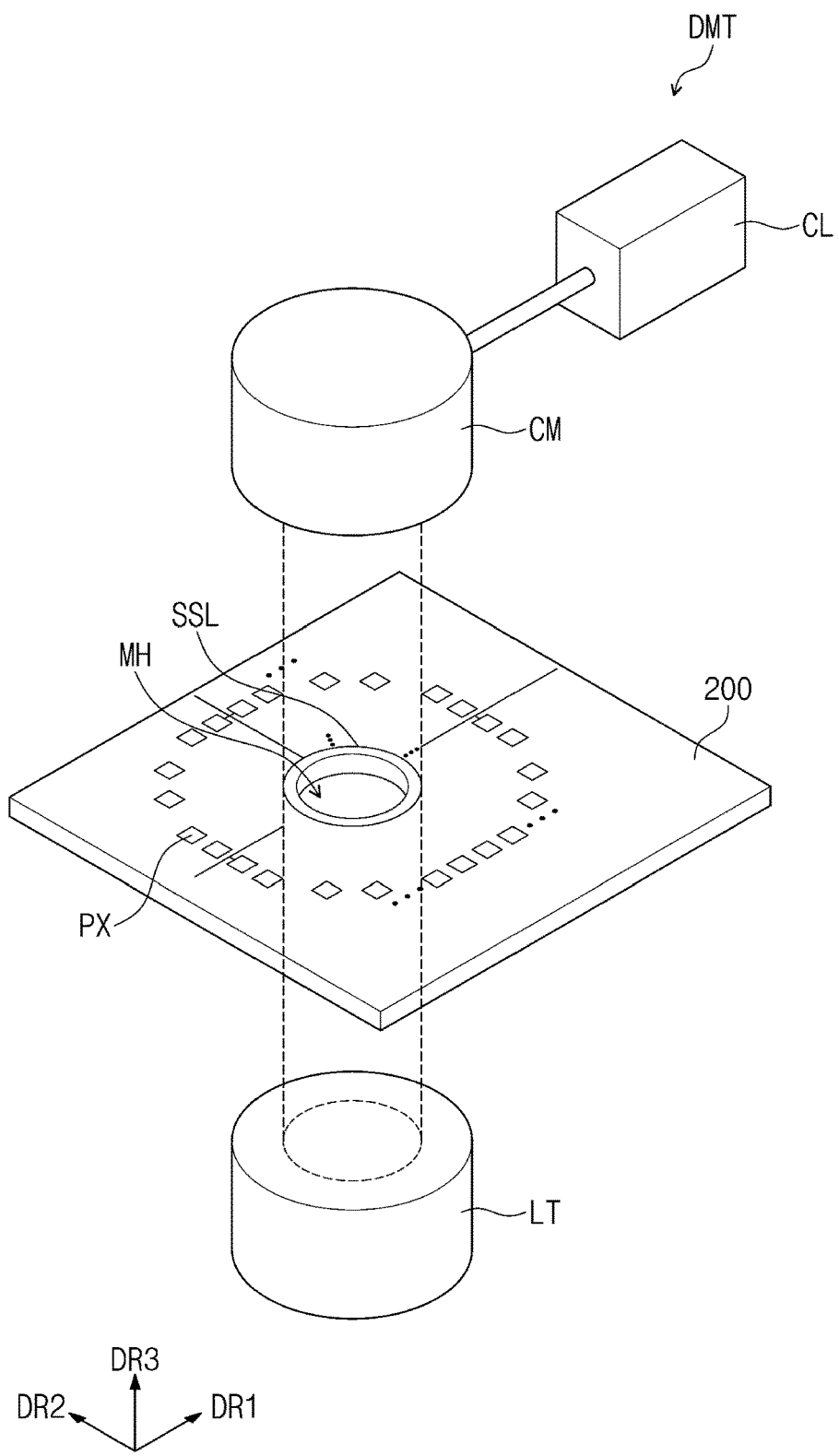
FIG. 6 is a perspective view illustrating an apparatus for testing a display module, according to an embodiment.

FIG. 5 is a flowchart illustrating a method for testing a display module by using an apparatus for testing a display module, according to an embodiment, and FIG. 6 is a perspective view illustrating an apparatus for testing a display module, according to an embodiment. Hereinafter, the same components as described with reference to FIG. 3 will be indicated by the same reference designators, and repeated descriptions thereto will be omitted.

Referring to FIGS. 3, 5, and 6, an apparatus DMT for testing a display module (hereinafter, referred to as a display module testing apparatus DMT) may include a light source/light source unit LT, a camera/camera unit CM, and an analyzer/analyzing unit CL.

The light source LT may face the camera CM with the display module 200 interposed therebetween. The camera CM may be located over the light source LT. The analyzer CL may be provided with an image obtained from the camera CM. The analyzer CL may be connected to the camera CM. However, embodiments are not limited thereto. In another embodiment, the analyzer CL may be provided with an image from the camera CM through a wireless communication system. The analyzer CL may be a computer that includes a communication interface for communicating with the camera CM, and that includes a processor. However, embodiments of the present disclosure are not limited thereto.

The light source LT may provide light to the display module 200 (T100). The camera CM may obtain an image of the display module 200 by using the provided light (T200). The analyzer CL may analyze the image provided from the camera CM (T300, T400, T500).

The light source LT and the camera CM may overlap with the hole MH and the signal lines SSL when viewed in a plan view. The light source LT may provide the light to the display module 200 in a state where the light source LT overlaps with the hole MH and the signal lines SSL (T100).

Figure 7:
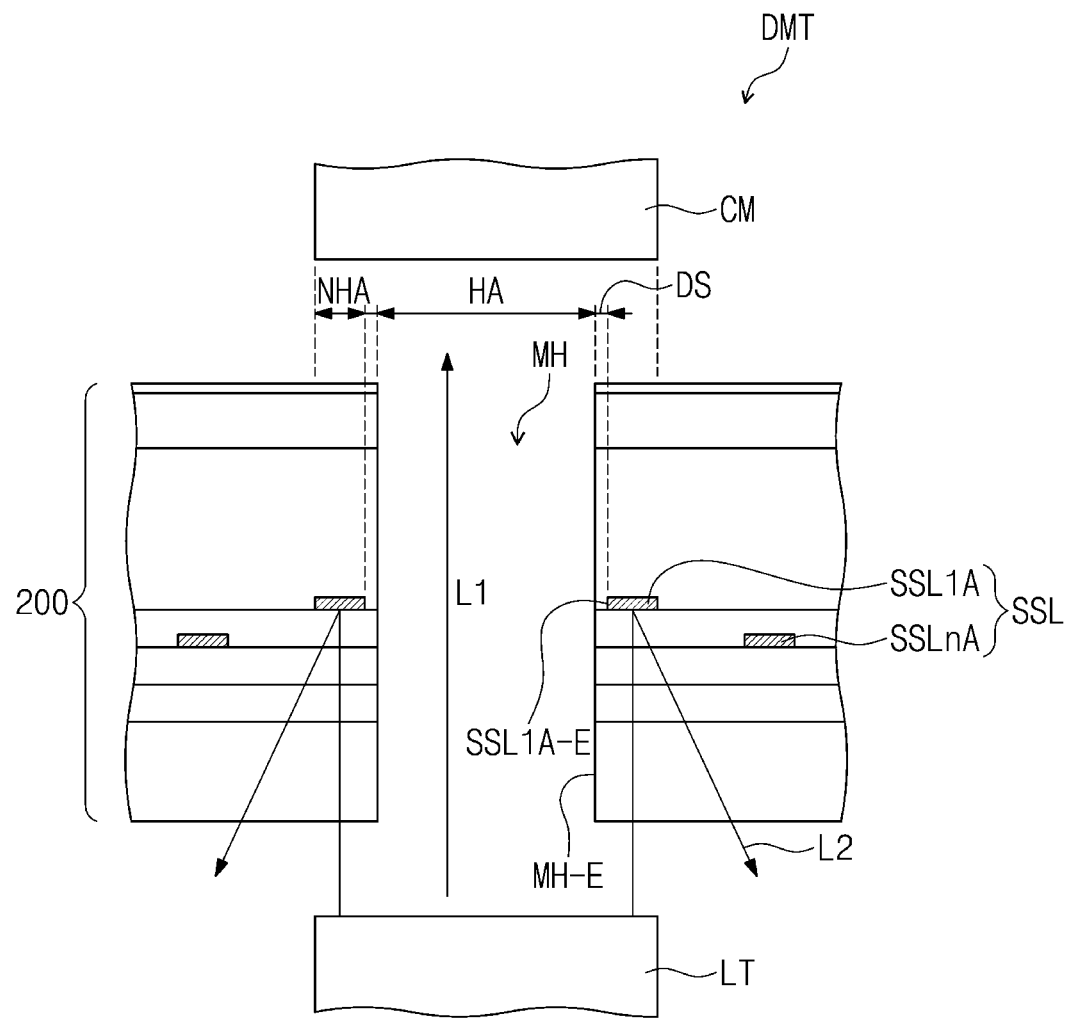
FIG. 7 is a cross-sectional view illustrating an apparatus for testing a display module, according to an embodiment.

FIG. 7 is a cross-sectional view illustrating an apparatus for testing a display module, according to an embodiment. Hereinafter, the same components as described with reference to FIG. 4 will be indicated by the same reference designators, and repeated descriptions thereto will be omitted.

Referring to FIGS. 4 to 7, the light source LT may provide light L1 and L2 toward the display module 200 (T100). The light L1 and L2 may include first light L1 and second light L2.

The first light L1 may pass through the hole MH. The first light L1 may be provided to the camera CM through the hole MH. The second light L2 may be reflected by the first signal line SSL1A. The second light L2 may be reflected by the first signal line SSL1A, and thus may not be provided to the camera CM.

The camera CM may obtain the image of the display module 200 toward which the light L1 and L2 is provided (T200).

The obtained image of the display module 200 may be transmitted from the camera CM to the analyzer CL. The obtained image of the display module 200 may be analyzed in the analyzer CL to measure a cutting accuracy of the hole MH.

Figure 8:
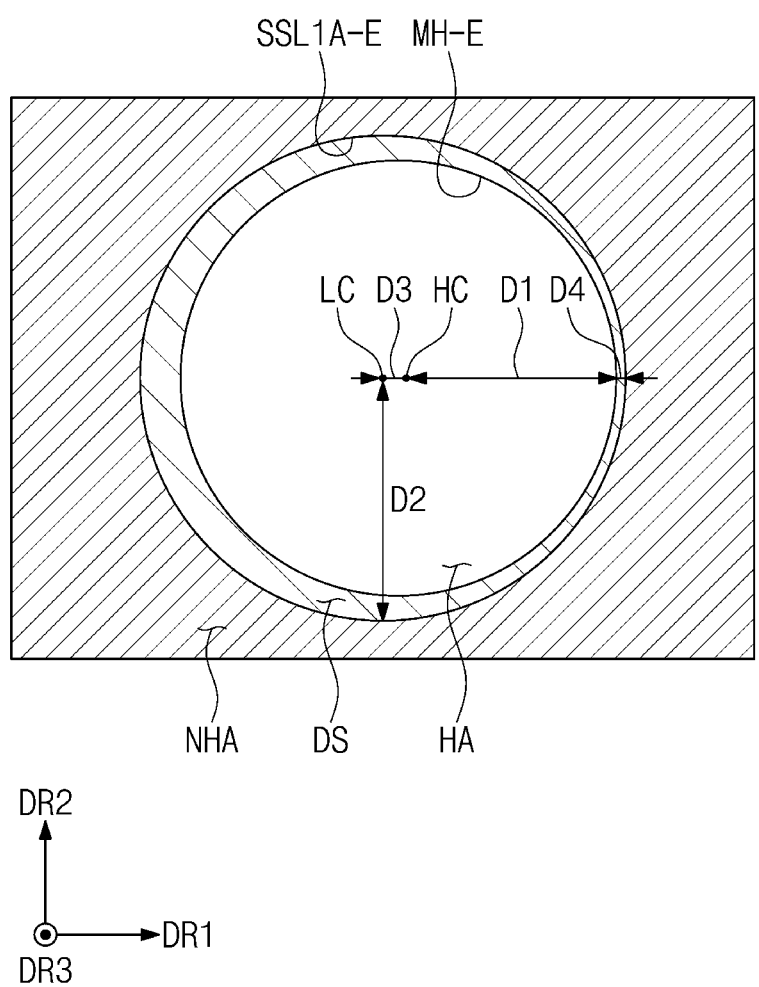
FIG. 8 is a plan view illustrating an image obtained by an apparatus for testing a display module, according to an embodiment.

FIG. 8 is a plan view illustrating an image obtained by an apparatus for testing a display module, according to an embodiment. Hereinafter, the same components as described with reference to FIG. 7 will be indicated by the same reference designators, and repeated descriptions thereto will be omitted.

Referring to FIGS. 5 to 8, the image obtained by the display module testing apparatus DMT may include a hole area HA, a dead space area DS, and a partial area NHA (hereinafter, referred to as a line area) of the line area LA (see FIG. 4). The image obtained by the camera CM may be transmitted to the analyzer CL, and may be analyzed by the analyzer CL.

The hole area HA may be an area in which the hole MH is provided. The hole area HA may be an area defined by the side surface MH-E of the hole MH. The first light L1 provided from the light source LT may pass through the hole area HA. The hole area HA may be the brightest portion in the image obtained by the camera CM. For example, the hole area HA may be shown as a white image.

The dead space area DS may be an area defined by the side surface MH-E of the hole MH and a side surface SSL1A-E of the first signal line SSL1A. The first signal line SSL1A may be the closest to the hole MH among the signal lines SSL.

A portion of the light L1 and L2 provided from the light source LT may pass through the dead space area DS. A light transmittance of the dead space area DS may be lower than that of the hole area HA, and thus the dead space area DS may be darker than the hole area HA. However, the light transmittance of the dead space area DS may be higher than that of the line area NHA, and thus the dead space area DS may be brighter than the line area NHA.

The second light L2 may be reflected by the signal line SSL in the line area NHA, and thus the second light L2 may not pass through the line area NHA. The line area NHA may be the darkest portion in the image obtained by the camera CM. For example, the line area NHA may be shown as a black image.

The analyzer CL may measure a first center HC and a first distance D1 (T300). The first center HC and the first distance D1 may be measured from a bright portion of the obtained image of the display module 200. For example, the first center HC may be a center of the hole MH (or the hole area HA).

The analyzer CL may measure the first distance D1 from the first center HC to an edge of the hole MH (or the hole area HA). The first distance D1 may be the shortest distance from the first center HC to the edge of the hole MH (or the hole area HA). For example, the first distance D1 may be a radius of the hole MH (or the hole area HA).

The analyzer CL may measure a second center LC and a second distance D2 (T400). The second center LC and the second distance D2 may be measured from a dark portion of the obtained image of the display module 200. The second center LC may be a center defined by a closed line (e.g., a closed curve) formed by the signal line SSL (or the line area NHA). For example, the second center LC may be a center of the closed curve formed by the signal line SSL.

The analyzer CL may measure the second distance D2 from the second center LC to the signal line SSL. The second distance D2 may be the shortest distance from the second center LC to the signal line SSL. For example, the second distance D2 may be a radius of the closed curve formed by the signal line SSL.

The analyzer CL may analyze the measured values to measure the cutting accuracy of the hole MH (T500).

The analyzer CL may calculate a third distance D3 between the first center HC and the second center LC.

The analyzer CL may compare a sum of the first distance D1 and the third distance D3 with the second distance D2. The analyzer CL may calculate a fourth distance D4 corresponding to a difference between the second distance D2 and the sum of the first distance D1 and the third distance D3. In other words, the fourth distance D4 may be expressed by the following equation.

$$\text{Fourth distance } D4 = \text{Second distance } D2 - (\text{First distance } D1 + \text{Third distance } D3) \quad \text{[Equation]}$$

The display module testing apparatus DMT may determine the display module 200 as being a good or suitable product when the second distance D2 is greater than the sum of the first distance D1 and the third distance D3. In other words, the display module testing apparatus DMT may determine the display module 200 as a good product when the fourth distance D4 has a positive value.

In another embodiment, the analyzer CL may compare the fourth distance D4 with a reference value (e.g., a reference value preset by a worker). For example, when the fourth distance D4 is equal to or greater than the reference value, the display module 200 may be determined to be a good product. The reference value for determining whether the display module 200 is a good product may be variously set depending on a product (e.g., a kind of the display module 200).

The display module testing apparatus DMT may determine the display module 200 as being a defective product when the second distance D2 is less than the sum of the first distance D1 and the third distance D3. In other words, the display module testing apparatus DMT may determine the display module 200 as a defective product when the fourth distance D4 has a negative value.

When the sum of the first distance D1 and the third distance D3 is greater than the second distance D2, the hole area HA may invade, or encroach into, the line area NHA, which may cause cutting of the signal line SSL.

According to the embodiments described above, the hole MH may be defined in the display module 200. The signal line SSL may be electrically connected to the pixel PX and may surround the hole MH in a plan view. The analyzer CL may measure the cutting accuracy of the hole MH by using the image of the hole MH and the signal line SSL. In other words, according to the described embodiments, an additional marker otherwise used as a reference for measuring the cutting accuracy of the hole MH may be omitted. Thus, an additional area for providing the marker may be omitted. As a result, an area (or size) of the dead space area DS may be reduced or minimized.

Figure 9:
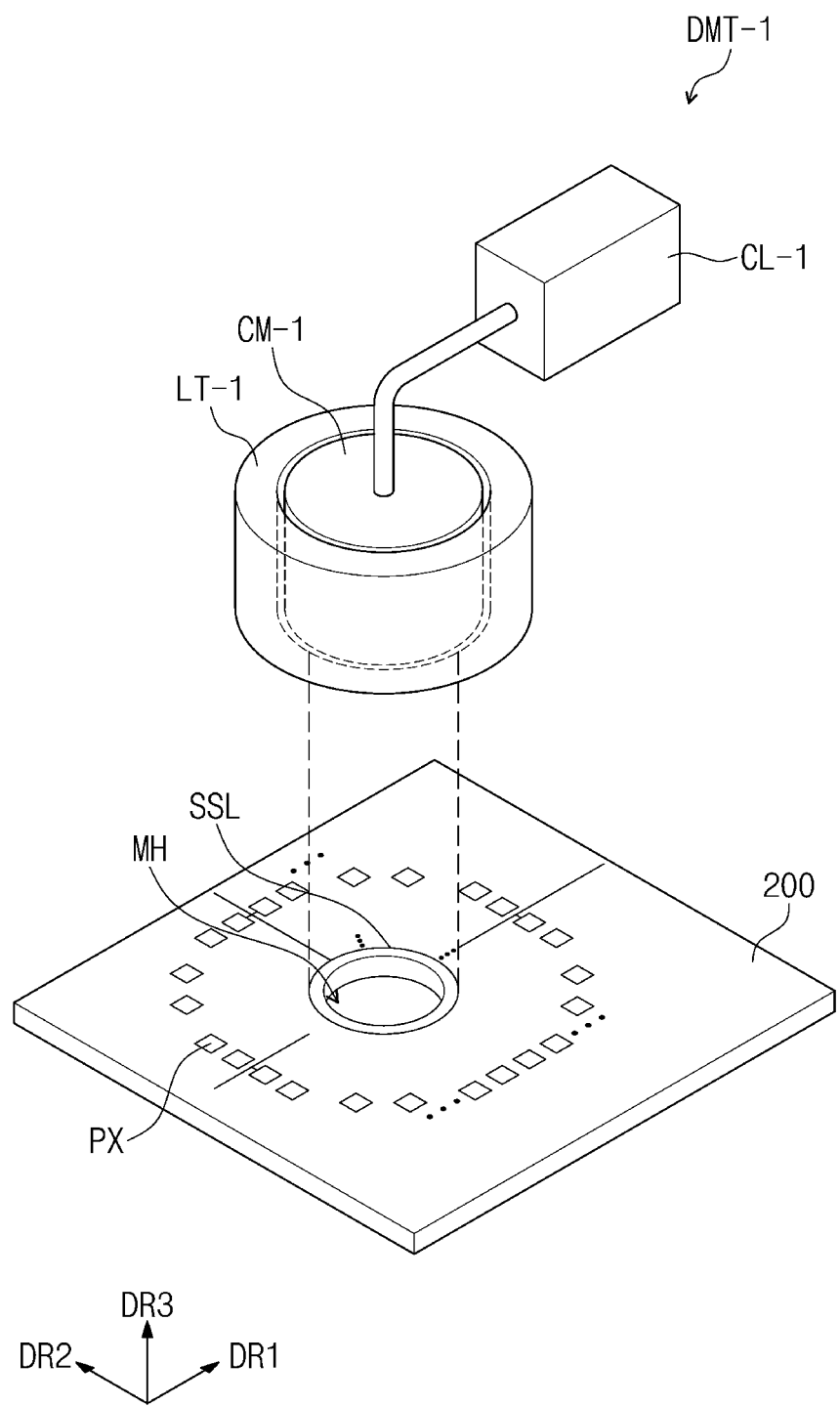
FIG. 9 is a perspective view illustrating an apparatus for testing a display module, according to an embodiment.

FIG. 9 is a perspective view illustrating an apparatus for testing a display module, according to an embodiment.

Referring to FIGS. 5 and 9, a display module testing apparatus DMT-1 may include a light source LT-1, a camera CM-1, and an analyzer CL-1.

The light source LT-1 and the camera CM-1 may be located over the display module 200. The light source LT-1 may surround the camera CM-1. However, embodiments are not limited thereto. In certain embodiments, the light source LT-1 and the camera CM-1 may be located at various positions over the display module 200. The light source LT-1 may provide light to the display module 200 (T100). The analyzer CL-1 may analyze an image obtained from the camera CM-1 (T500).

Figure 10:
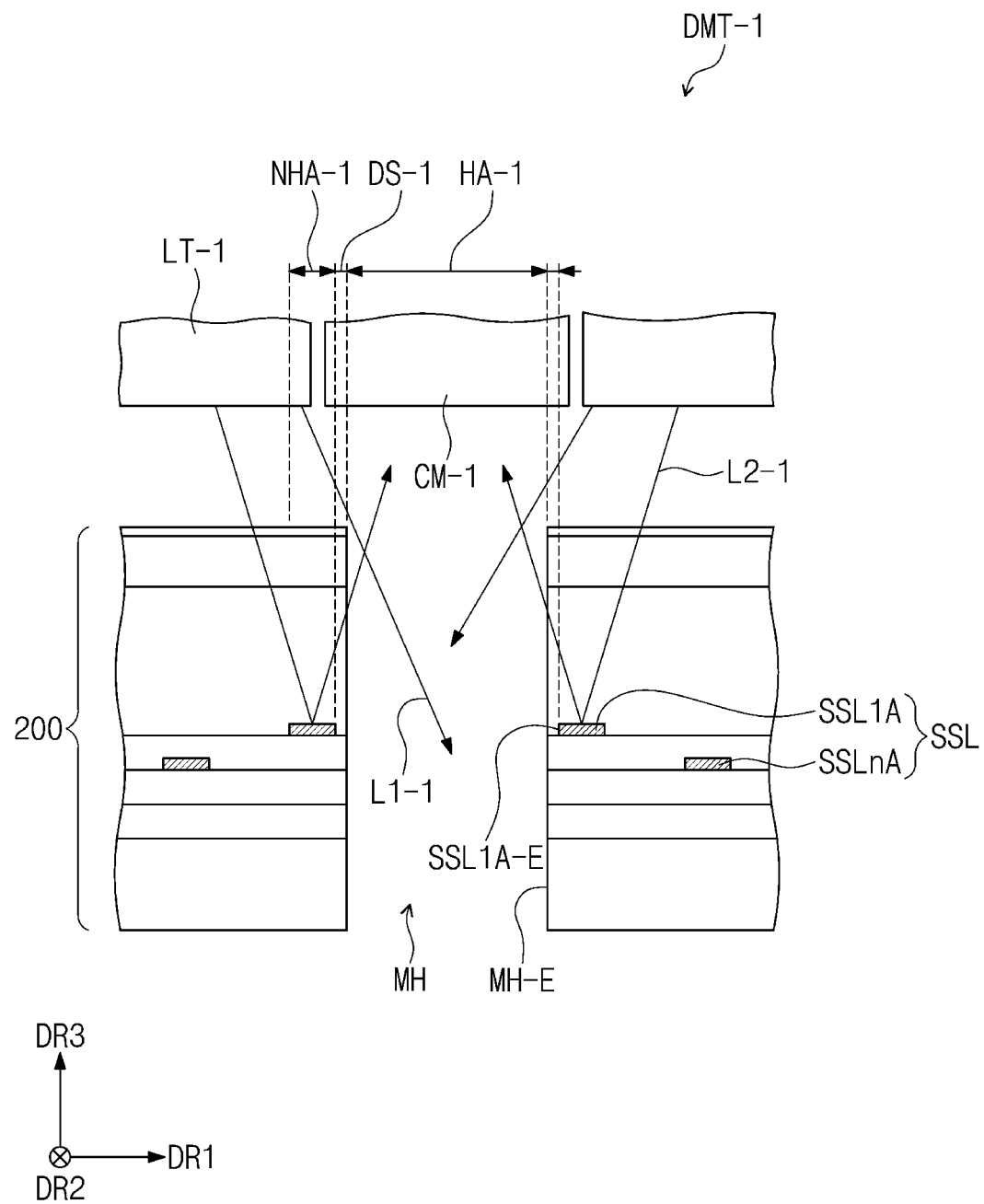
FIG. 10 is a cross-sectional view illustrating an apparatus for testing a display module, according to an embodiment.

FIG. 10 is a cross-sectional view illustrating an apparatus for testing a display module, according to an embodiment. Hereinafter, the same components as described with reference to FIG. 4 will be indicated by the same reference designators, and repeated descriptions thereto will be omitted.

Referring to FIGS. 4, 5, 9, and 10, the light source LT-1 may provide light L1-1 and L2-1 to the display module 200 (T100). The light L1-1 and L2-1 may include first light L1-1 and second light L2-1.

The first light L1-1 may pass through the hole MH. The first light L1-1 may pass through the hole MH, and thus may not be provided to the camera CM-1.

The second light L2-1 may be reflected by the first signal line SSL1A. The second light L2-1 may be reflected by the first signal line SSL1A, and then may be provided to the camera CM-1.

The camera CM-1 may obtain an image of the display module 200 to which the light L1-1 and L2-1 is provided (T200).

The obtained image of the display module 200 may be transmitted from the camera CM-1 to the analyzer CL-1. The obtained image of the display module 200 may be analyzed in the analyzer CL-1 to measure a cutting accuracy of the hole MH.

Figure 11:
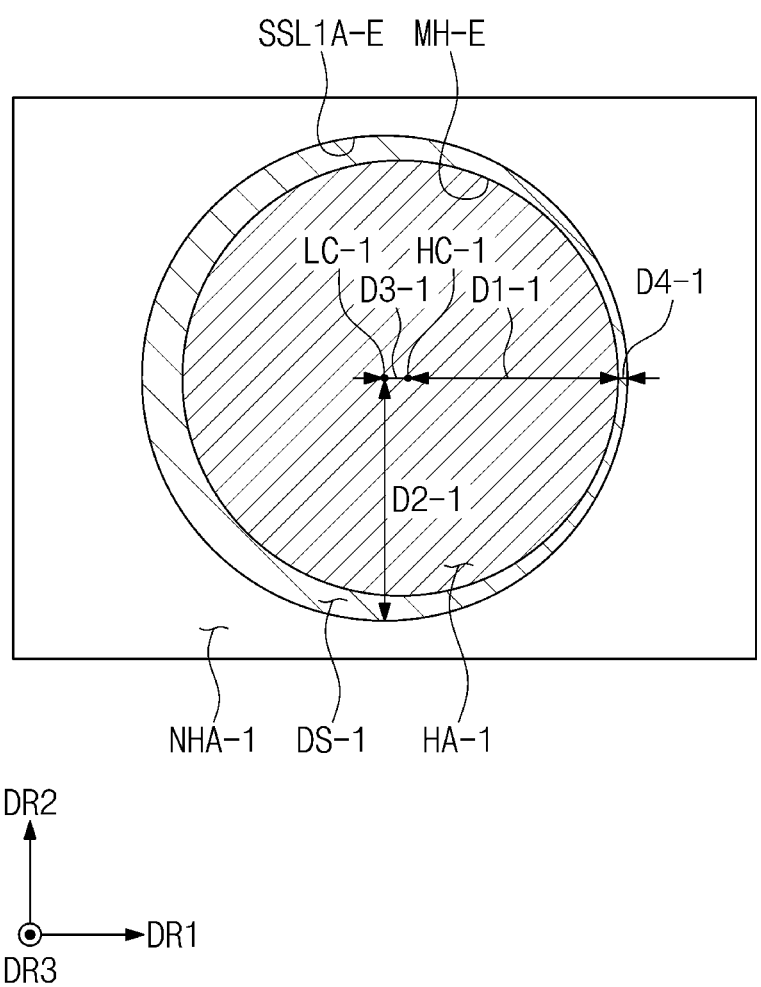
FIG. 11 is a plan view illustrating an image obtained by an apparatus for testing a display module, according to an embodiment.

FIG. 11 is a plan view illustrating an image obtained by an apparatus for testing a display module, according to an embodiment. Hereinafter, the same components as described with reference to FIGS. 8 and 10 will be indicated by the same reference designators, and repeated descriptions thereto will be omitted.

Referring to FIGS. 5, 10, and 11, the image obtained by the display module testing apparatus DMT-1 may include a hole area HA-1, a dead space area DS-1, and a line area NHA-1. The image obtained by the camera CM-1 may be transmitted to the analyzer CL-1 and may be analyzed by the analyzer CL-1.

The first light L1-1 provided from the light source LT-1 may pass through the hole area HA-1. The hole area HA-1 may be the darkest portion in the image obtained by the camera CM-1. For example, the hole area HA-1 may be shown as a black image.

A portion of the light L1-1 and L2-1 provided from the light source LT-1 may pass through the dead space area DS-1. A light transmittance of the dead space area DS-1 may be lower than that of the hole area HA-1, and thus the dead space area DS-1 may be brighter than the hole area HA-1. However, the light transmittance of the dead space area DS-1 may be higher than that of the line area NHA-1, and thus the dead space area DS-1 may be darker than the line area NHA-1.

In the line area NHA-1, the second light L2-1 may be reflected by the signal line SSL, and then may be provided to the camera CM-1. The line area NHA-1 may be the brightest portion in the image obtained by the camera CM-1. For example, the line area NHA-1 may be shown as a white image.

The analyzer CL-1 may measure a first center HC-1 and a first distance D1-1 (T300). The first center HC-1 and the first distance D1-1 may be measured from a dark portion of the obtained image of the display module 200. For example, the first center HC-1 may be a center of the hole MH (or the hole area HA-1), and the first distance D1-1 may be a radius of the hole MH (or the hole area HA-1).

The analyzer CL-1 may measure a second center LC-1 and a second distance D2-1 (T400). The second center LC-1 and the second distance D2-1 may be measured from a bright portion of the obtained image of the display module 200. For example, the second center LC-1 may be a center of a closed curve formed by the signal line SSL, and the second distance D2-1 may be a radius of the closed curve formed by the signal line SSL.

The analyzer CL-1 may calculate a third distance D3-1 from the first center HC-1 to the second center LC-1. The analyzer CL-1 may analyze the measured values to measure the cutting accuracy of the hole MH (T500).

The analyzer CL-1 may calculate a fourth distance D4-1 corresponding to a difference between the second distance D2-1 and a sum of the first distance D1-1 and the third distance D3-1. The analyzer CL-1 may compare the fourth distance D4-1 with a reference value, which may be preset by a worker.

According to the embodiments, the analyzer CL-1 may measure the cutting accuracy of the hole MH by using the image of the hole MH and the signal line SSL. In other words, according to the embodiments, a marker that would otherwise be used as a reference for measuring the cutting accuracy of the hole MH may be omitted. Thus, an additional area for providing the marker may be omitted. As a result, an area (or size) of the dead space area DS-1 may be reduced or minimized.

Figure 12A:
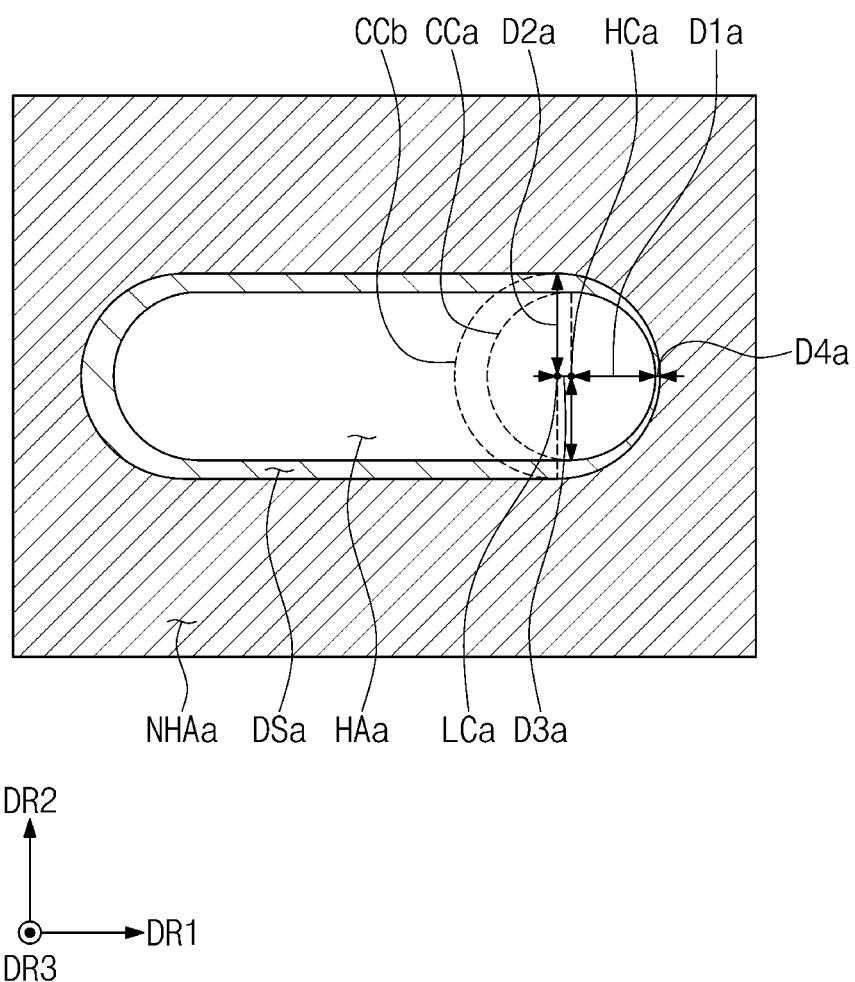
FIGS. 12A and 12B are plan views illustrating images obtained by an apparatus for testing a display module, according to an embodiment.

FIG. 12A is a plan view illustrating an image obtained by an apparatus for testing a display module, according to an embodiment. Hereinafter, the same components as described with reference to FIG. 8 will be indicated by the same reference designators, and repeated descriptions thereto will be omitted.

Referring to FIGS. 6, 8, and 12A, a portion of each of a signal line SSL (or a line area NHAa) and a hole MH (or a hole area HAa) may have a linear shape, and another portion thereof may have a curvature, when viewed in a plan view. First and second circles CCa and CCb respectively having radii of curvature corresponding to portions having curvatures are illustrated by dotted lines in FIG. 12A.

The analyzer CL may measure a first center HCa of the first circle CCa, and a first distance D1$a$ from the first center HCa to the portion of the hole MH having the curvature. For example, the first distance D1$a$ may correspond to a radius of the first circle CCa.

The analyzer CL may measure a second center LCa of the second circle CCb, and a second distance D2$a$ from the second center LCa to the portion of the signal line SSL having the curvature. For example, the second distance D2$a$ may correspond to a radius of the second circle CCb.

The analyzer CL may calculate a third distance D3$a$ from the first center HCa to the second center LCa.

The analyzer CL may calculate a fourth distance D4$a$ corresponding to a difference between the second distance D2$a$ and a sum of the first distance D1$a$ and the third distance D3$a$. The analyzer CL may compare the fourth distance D4$a$ with a reference value (e.g. a reference value preset by a worker), thereby measuring a cutting accuracy of the hole MH.

According to the described embodiments, even though the shapes of the hole MH and the signal line SSL may be modified or changed, the cutting accuracy of the hole MH may be tested using the shapes of the hole MH and the signal line SSL without using an additional marker or changing a position of a marker. Thus, even though the shapes of the hole MH and the signal line SSL are variously modified, the cutting accuracy of the hole MH may be easily measured using the display module testing apparatus DMT.

Figure 12B:
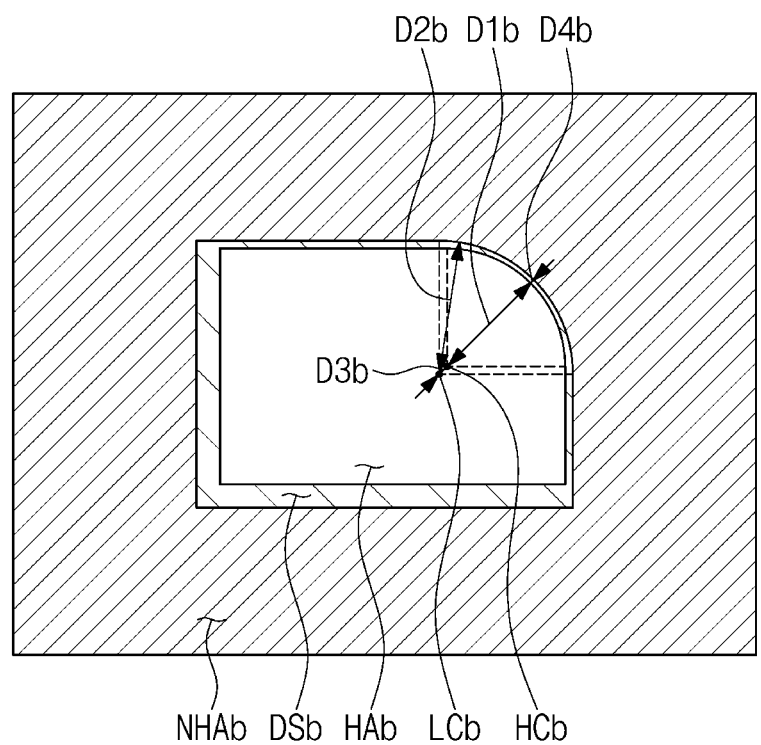
Figure 12B:
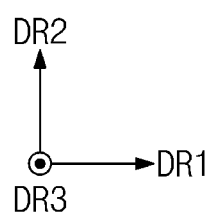

FIG. 12B is a plan view illustrating an image obtained by an apparatus for testing a display module, according to an embodiment. Hereinafter, the same components as described with reference to FIG. 8 will be indicated by the same reference designators, and repeated descriptions thereto will be omitted.

Referring to FIGS. 6, 8, and 12B, each of a hole MH (or a hole area HAb) and a closed line formed by a signal line SSL (or a line area NHAb) may have a polygonal shape in which at least one vertex has a curvature, when viewed in a plan view. For example, each of the hole MH and the closed line formed by the signal line SSL may have a quadrilateral shape in which one vertex and a portion corresponding thereto have the curvature. An area having the curvature may have a fan shape, and this is illustrated by a dotted line.

The analyzer CL may measure a first center HCb, and a first distance D1b from the fan shape of the portion of the hole MH (or the hole area HAb). For example, the first center HCb may be a center of a circle including the fan shape. The first distance D1b may correspond to a radius of the circle.

The analyzer CL may measure a second center LCb, and a second distance D2b from the fan shape of the portion of the closed line formed by the signal line SSL (or the line area NHAb). For example, the second center LCb may be a center of a circle including the fan shape of the closed line. The second distance D2b may correspond to a radius of the circle.

The analyzer CL may calculate a third distance D3b from the first center HCb to the second center LCb.

The analyzer CL may calculate a fourth distance D4b corresponding to a difference between the second distance D2b and a sum of the first distance D1b and the third distance D3b. The analyzer CL may compare the fourth distance D4b with a reference value (e.g., a reference value preset by a worker), thereby measuring a cutting accuracy of the hole MH.

According to the described embodiments, even though the shapes of the hole MH and the signal line SSL are modified or changed, the cutting accuracy of the hole MH may be tested using the shapes of the hole MH and the signal line SSL without disposing an additional marker or changing a position of a marker. Thus, even though the shapes of the hole MH and the signal line SSL are variously modified, the cutting accuracy of the hole MH may be easily measured using the display module testing apparatus DMT.

Figure 13A:
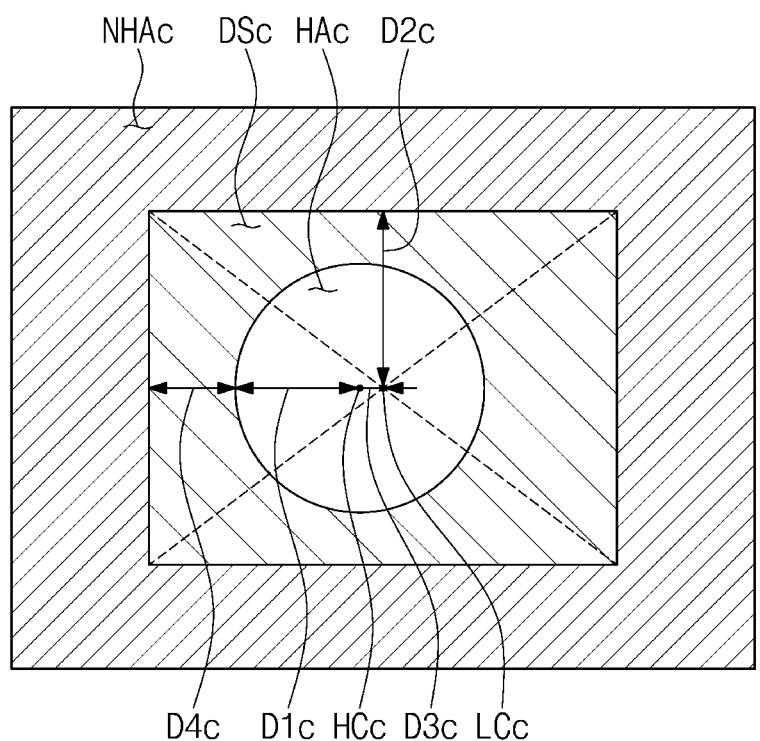
FIGS. 13A and 13B are plan views illustrating images obtained by an apparatus for testing a display module, according to an embodiment.
Figure 13A:
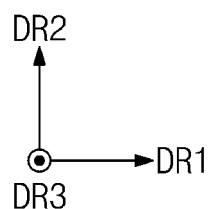
Figure 13B:
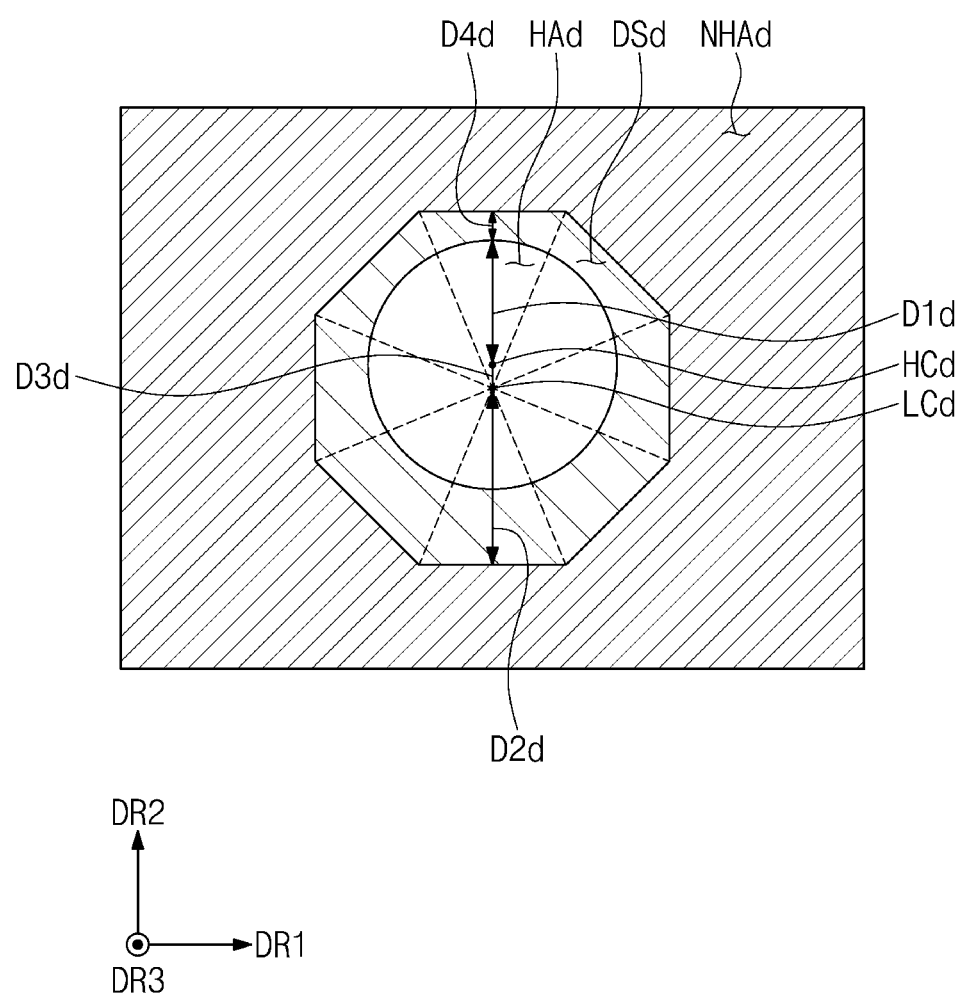

FIGS. 13A and 13B are plan views illustrating images obtained by an apparatus for testing a display module, according to an embodiment. Hereinafter, the same components as described with reference to FIG. 8 will be indicated by the same reference designators, and repeated descriptions thereto will be omitted.

Referring to FIGS. 8, 13A, and 13B, a closed line formed by a signal line SSL (or a line area NHAc or NHAd) may have a polygonal shape, when viewed in a plan view. For example, the closed line formed by the signal line SSL may have a quadrilateral shape or an octagonal shape, when viewed in a plan view. The closed line formed by the signal line SSL has a quadrilateral shape in FIG. 13A, and the closed line formed by the signal line SSL has an octagonal shape in FIG. 13B.

In FIG. 13A, the analyzer CL may measure a first center HCc and a first distance D1c from the hole MH (or a hole area HAc).

The analyzer CL may measure a second center LCc of the quadrilateral shape formed by the signal line SSL (or the line area NHAc), and a second distance D2c corresponding to the shortest distance from the second center LCc to the signal line SSL (or the line area NHAc).

The analyzer CL may calculate a third distance D3c from the first center HCc to the second center LCc.

The analyzer CL may calculate a fourth distance D4c corresponding to a difference between the second distance D2c and a sum of the first distance D1c and the third distance D3c. The analyzer CL may compare the fourth distance D4c with a reference value, which may be preset by a worker, thereby measuring a cutting accuracy of the hole MH.

In FIG. 13B, the analyzer CL may measure a first center HCd and a first distance D1d from the hole MH (or a hole area HAd).

The analyzer CL may measure a second center LCd of the octagonal shape formed by the signal line SSL (or the line area NHAd), and a second distance D2d corresponding to the shortest distance from the second center LCd to the signal line SSL (or the line area NHAd).

The analyzer CL may calculate a third distance D3d from the first center HCd to the second center LCd.

The analyzer CL may calculate a fourth distance D4d corresponding to a difference between the second distance D2d and a sum of the first distance D1d and the third distance D3d. The analyzer CL may compare the fourth distance D4d with a reference value, which may be preset by a worker, thereby measuring a cutting accuracy of the hole MH.

According to the embodiments, the signal line SSL may surround the hole MH, defined in the display module 200, in the polygonal shape. Even though the shape of the signal line SSL is modified or changed, the cutting accuracy of the hole MH may be tested using the shapes of the hole MH and the signal line SSL without an additional marker and without changing a position of a marker. Thus, even though the shapes of the hole MH and the signal line SSL are variously modified, the cutting accuracy of the hole MH may be easily measured using the display module testing apparatus DMT.

According to the embodiments, the hole may be defined in the display module. The signal line may be electrically connected to the pixel and may surround the hole in a plan view. The display module testing apparatus may measure the cutting accuracy by using the obtained image of the hole and the signal line and may measure the cutting accuracies corresponding to the holes having various shapes and the signal lines having various shapes. An additional marker for measuring a cutting accuracy may be omitted to reduce or minimize the dead space area between the hole area and the active area.

While various embodiments have been described, it will be apparent to those skilled in the art that various changes and modifications may be made without departing from the spirit and scope of the present disclosure. Therefore, it should be understood that the above embodiments are not limiting, but are illustrative. Thus, the scopes are to be determined by the broadest permissible interpretation of the following claims and their functional equivalents, and shall not be restricted or limited by the foregoing description.

What is claimed is:

1. A method for testing a display module, the method comprising:
   providing light to the display module;
   obtaining an image of the display module;
   measuring a first center of a hole in the display module;
   measuring a first distance from the first center to an edge of the hole;
   measuring a second center of a closed line formed by a signal line of the display module;
   measuring a second distance from the second center to the signal line;
   calculating a third distance between the first center and the second center; and
   comparing the second distance with a sum of the first distance and the third distance.

2. The method of claim 1, wherein the first center and the first distance are measured from a bright portion of the obtained image.

3. The method of claim 2, wherein the second center and the second distance are measured from a dark portion of the obtained image of the display module.

4. The method of claim 1, wherein the first center and the first distance are measured from a dark portion of the obtained image.

5. The method of claim 4, wherein the second center and the second distance are measured from a bright portion of the obtained image.

6. The method of claim 1, wherein the first distance is a shortest distance from the first center to the edge of the hole.

7. The method of claim 1, wherein the second distance is a shortest distance from the second center to the signal line.

8. The method of claim 1, wherein at least a portion of the hole comprises a portion of a circle having a curvature.

9. The method of claim 1, wherein the closed line formed by the signal line has a circular shape or a polygonal shape.

10. The method of claim 1, further comprising determining that the display module is a good product when the sum of the first distance and the third distance is less than the second distance.

11. The method of claim 1, wherein the comparing of the second distance with the sum of the first distance and the third distance comprises calculating a difference between the second distance and the sum of the first distance and the third distance.

12. The method of claim 11, wherein the comparing of the second distance with the sum of the first distance and the third distance further comprises comparing the difference with a reference value.

13. An apparatus for testing a display module, the apparatus comprising:
   a light source configured to provide light to the display module;
   a camera configured to obtain an image of the display module using the provided light; and
   an analyzer configured to analyze the obtained image, wherein the display module comprises:
   a base layer comprising an active area with a hole defined therein, and a peripheral area adjacent to the active area;
   signal lines at the active area, and surrounding the hole in a plan view; and
   pixels at the active area, and electrically connected to the signal lines,
   wherein the analyzer is configured to compare a sum of a third distance, which is from a first center of the hole to a second center of a closed line formed by a signal line that is closest to the hole in the plan view among the signal lines, and a first distance, which is from the first center to an edge of the hole, with a second distance, which is from the second center to the signal line closest to the hole among the signal lines.

14. The apparatus of claim 13, wherein the light source faces the camera with the display module therebetween.

15. The apparatus of claim 13, wherein the light source and the camera are located over the display module.

16. The apparatus of claim 13, wherein each of the signal lines forms a closed line surrounding the hole when viewed in the plan view.

17. The apparatus of claim 16, wherein the closed line formed by each of the signal lines in the plan view has a circular shape or a polygonal shape.

18. The apparatus of claim 13, wherein the hole has a polygonal shape of which at least one vertex has a curvature in the plan view.

19. The apparatus of claim 13, wherein the light source is configured to provide the light to the display module in a state where the light source, the camera, and the hole overlap each other in the plan view.

20. The apparatus of claim 13, wherein the light source is configured to provide the light to the display module in a state where the light source, the camera, and the signal lines overlap each other in the plan view.

* * * * *